(12) United States Patent
Oshima et al.

(10) Patent No.: US 11,841,382 B2
(45) Date of Patent: Dec. 12, 2023

(54) INFORMATION PROVIDING APPARATUS, INFORMATION PROVIDING METHOD, AND SYSTEM

(71) Applicant: HONDA MOTOR CO., LTD., Tokyo (JP)

(72) Inventors: Ryo Oshima, Wako (JP); Sho Takada, Wako (JP); Nobuyuki Sasaki, Wako (JP); Mio Oshima, Wako (JP); Yoshihiro Matsunaga, Wako (JP); Mitsuhiro Ito, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 649 days.

(21) Appl. No.: 17/018,787

(22) Filed: Sep. 11, 2020

(65) Prior Publication Data
US 2020/0408807 A1 Dec. 31, 2020

Related U.S. Application Data

(63) Continuation of application No. PCT/JP2018/044477, filed on Dec. 4, 2018.

(30) Foreign Application Priority Data

Mar. 20, 2018 (JP) .................. 2018-052599

(51) Int. Cl.
G01R 11/56 (2006.01)
G06Q 30/0283 (2023.01)
(Continued)

(52) U.S. Cl.
CPC ......... G01R 11/56 (2013.01); G06Q 30/0283 (2013.01); G06Q 30/0645 (2013.01); H01M 10/48 (2013.01); H02J 7/0047 (2013.01)

(58) Field of Classification Search
CPC .............. G01R 11/56; G06Q 30/0283; G06Q 30/0645; G06Q 50/06; G06Q 50/10;
(Continued)

(56) References Cited

U.S. PATENT DOCUMENTS 5,835,383 A 11/1998 Onizuka et al.
8,930,146 B2 1/2015 Katsukura et al.
(Continued)

FOREIGN PATENT DOCUMENTS

CN 106226572 A 12/2016
JP 2002271982 A 9/2002
(Continued)

OTHER PUBLICATIONS

G. Gutiérrez-Alcaraz, "Dynamic pricing and area-time specific marginal capacity cost for distribution investment deferment," 2011 IEEE Power and Energy Society General Meeting, Detroit, MI, USA, 2011, pp. 1-6, doi: 10.1109/PES.2011.6039508 (Year: 2011).*
(Continued)

Primary Examiner — Tung X Nguyen
Assistant Examiner — Robert P Alejnikov, Jr.
(74) Attorney, Agent, or Firm — Thomas | Horstemeyer, LLP

(57) ABSTRACT

The present invention provides an information providing apparatus including a determining unit configured to determine an added value to be provided to a user of a portable electric power supply device including a storage battery that stores electric power to be supplied to electrical equipment detachably connected, wherein in a case where a kind of the electrical equipment is a specified kind of electrical equipment, the determining unit determines the added value to be provided to the user in such a manner that the added value to be provided to the user is higher than an added value in
(Continued)

a case where the kind of the electrical equipment is not the specified kind of electrical equipment.

11 Claims, 7 Drawing Sheets

(51) Int. Cl.
    *G06Q 30/0645* (2023.01)
    *H02J 7/00* (2006.01)
    *H01M 10/48* (2006.01)

(58) Field of Classification Search
    CPC ...... H02J 7/0047; H02J 2300/10; H02J 3/381; H02J 7/34; H02J 13/00002; Y02E 60/00; Y02E 40/70; Y04S 10/30; Y04S 50/10; Y04S 50/14; Y04S 10/12
    USPC .......................................................... 324/116
    See application file for complete search history.

(56) References Cited

U.S. PATENT DOCUMENTS

| | | | |
|---|---|---|---|
| 9,065,301 B2 | 6/2015 | Takayama et al. | |
| 9,114,721 B2 | 8/2015 | Tsuda | |
| 9,207,268 B2 | 12/2015 | Fujiwara et al. | |
| 9,233,620 B2 | 1/2016 | Hara | |
| 9,343,905 B2 | 5/2016 | Katagi et al. | |
| 9,665,917 B2 | 5/2017 | Tsuda | |
| 10,027,153 B2 | 7/2018 | Toya et al. | |
| 10,074,987 B2 | 9/2018 | Fukubayashi et al. | |
| 10,243,375 B2 | 3/2019 | Toya | |
| 10,367,361 B2 | 7/2019 | Toya et al. | |
| 10,559,966 B2 | 2/2020 | Toya et al. | |
| 10,564,661 B2 | 2/2020 | Katagi et al. | |
| 10,866,568 B2 | 12/2020 | Hummon et al. | |
| 11,709,465 B2 | 7/2023 | Hummon et al. | |
| 2009/0206059 A1* | 8/2009 | Kiko ................ H02J 13/00017 218/143 | |
| 2011/0010106 A1 | 1/2011 | Katsukura et al. | |
| 2012/0109409 A1 | 5/2012 | Hara | |
| 2012/0203387 A1 | 8/2012 | Takayama et al. | |
| 2012/0310428 A1 | 12/2012 | Katagi et al. | |
| 2013/0067253 A1 | 3/2013 | Tsuda | |
| 2014/0070790 A1* | 3/2014 | Fujiwara ................ G01R 21/00 324/76.11 | |
| 2014/0354235 A1 | 12/2014 | Chauhdary et al. | |
| 2015/0317755 A1 | 11/2015 | Tsuda | |
| 2015/0372518 A1 | 12/2015 | Toya et al. | |
| 2016/0087314 A1 | 3/2016 | Arashima et al. | |
| 2016/0226250 A1 | 8/2016 | Fukubayashi et al. | |
| 2016/0313754 A1 | 10/2016 | Katagi et al. | |
| 2017/0063110 A1* | 3/2017 | Toya ........................ H02J 50/80 |
| 2017/0070089 A1 | 3/2017 | Fukubayashi et al. | |
| 2017/0148039 A1 | 5/2017 | Wilhelm et al. | |
| 2017/0288401 A1 | 10/2017 | Hummon et al. | |
| 2017/0310161 A1* | 10/2017 | Tokunaga ............... H02J 3/004 |
| 2018/0240201 A1 | 8/2018 | Eda et al. | |
| 2018/0294663 A1 | 10/2018 | Toya et al. | |
| 2019/0296567 A1 | 9/2019 | Toya et al. | |
| 2020/0136409 A1 | 4/2020 | Toya et al. | |
| 2021/0294283 A1 | 9/2021 | Hummon et al. | |

FOREIGN PATENT DOCUMENTS

| | | |
|---|---|---|
| JP | 2003123848 A | 4/2003 |
| JP | 2011022156 A | 2/2011 |
| JP | 2011118638 A | 6/2011 |
| JP | 2012108870 A | 6/2012 |
| JP | 2014075964 A | 4/2014 |
| JP | 2015015827 A | 1/2015 |
| JP | 2015501627 A | 1/2015 |
| JP | 2017045450 A | 3/2017 |
| KR | 10-2016-0029414 A | 3/2016 |
| WO | 2009/125627 A1 | 10/2009 |
| WO | 2009/125659 A1 | 10/2009 |
| WO | 2013/058616 A2 | 4/2013 |
| WO | 2013/058616 A3 | 4/2013 |
| WO | 2014/167889 A1 | 10/2014 |
| WO | 2015/001930 A1 | 1/2015 |
| WO | 2015/115069 A1 | 8/2015 |
| WO | 2017/134934 A1 | 8/2017 |
| WO | 2019/181083 A1 | 9/2019 |
| WO | 2019/181084 A1 | 9/2019 |

OTHER PUBLICATIONS

Office Action for U.S. Appl. No. 17/018,798 dated Jun. 14, 2023.
U.S. Appl. No. 17/018,798, filed Sep. 11, 2020 entitled "Information Providing Apparatus, Information Providing Method, and System" (Related Case).
US Office Action for U.S. Appl. No. 17/018,798 dated Oct. 5, 2023.

* cited by examiner

FIG. 6

POINT : 95

3A

ABOVE POINT IS
PROVIDED

INFORMATION PROVIDING APPARATUS, INFORMATION PROVIDING METHOD, AND SYSTEM

CROSS-REFERENCE TO RELATED APPLICATION(S)

This application is a continuation of International Patent Application No. PCT/JP2018/044477 filed on Dec. 4, 2018, which claims priority to and the benefit of Japanese Patent Application No. 2018-52599 filed on Mar. 20, 2018, the entire disclosures of which are incorporated herein by reference.

BACKGROUND OF THE INVENTION

Field of the Invention

The present invention relates to an information providing apparatus, an information providing method, and a system.

Description of the Related Art

Techniques of collecting and managing information on equipment over a communication network have been proposed (see PTL 1 and PTL 2). PTL 1 discloses a system in which an electricity company purchases surplus electric power generated by an electric power generator of an electric power generation company and supplies such electric power directly to an electric power user from the electric power generation company through a power grid. PTL 2 discloses a server to which a battery rental service company sets rental fees for batteries based on amounts of electricity that can be stored in the batteries and that charges a rental fee for a battery provided to a user.

CITATION LIST

Patent Literature

PTL 1: Japanese Patent Laid-Open No. 2002-271982
PTL 2: Japanese Patent Laid-Open No. 2011-118638

SUMMARY OF THE INVENTION

Portable electric power supply devices, typically portable electric power generators and portable batteries have recently come into widespread use for recreation and business activities, as an electric power source for electrical equipment used outside. Therefore, rental service companies of portable electric power supply devices tend to increase in number, bringing about fierce competition between the rental service companies. Thus, a rental service company desires a technique that has an advantage over those of other rental service companies, for example, a technique that manages (utilizes) surplus electric power of a portable electric power supply device usefully for a user of the electric power supply device.

Therefore, an objective of the present invention is to provide a technique having an advantage in managing surplus electric power of a portable electric power supply device.

The present invention provides an information providing apparatus including a receiving unit configured to receive, from a portable electric power supply device including a storage battery that stores electric power to be supplied to electrical equipment detachably connected, electric power information relating to an amount of electric power stored in the storage battery and a feature quantity relating to electric power supplied to the electrical equipment, a calculating unit configured to calculate an amount of electric power used by a user of the electric power supply device based on the electric power information received by the receiving unit, an inferring unit configured to infer a kind of the electrical equipment based on the feature quantity received by the receiving unit, and a determining unit configured to determine an added value to be provided to the user of the electric power supply device based on the amount of electric power calculated by the calculating unit and the kind of the electrical equipment inferred by the inferring unit, wherein in a case where the kind of the electrical equipment inferred by the inferring unit is a specified kind of electrical equipment, the determining unit determines the added value to be provided to the user in such a manner that the added value to be provided to the user is higher than an added value in a case where the kind of the electrical equipment inferred by the inferring unit is not the specified kind of electrical equipment.

The present invention provides an information providing method including a server receiving, from a portable electric power supply device including a storage battery that stores electric power to be supplied to electrical equipment detachably connected, electric power information relating to an amount of electric power stored in the storage battery and a feature quantity relating to electric power supplied to the electrical equipment, the server calculating an amount of electric power used by the user of the electric power supply device based on the electric power information received, the server inferring a kind of the electrical equipment based on the feature quantity received, and the server determining an added value to be provided to the user of the electric power supply device based on the amount of electric power calculated and the kind of the electrical equipment inferred, wherein in the determining, in a case where the kind of the electrical equipment inferred is a specified kind of electrical equipment, the added value to be provided to the user is determined in such a manner that the added value to be provided to the user is higher than an added value in a case where the kind of the electrical equipment inferred is not the specified kind of electrical equipment.

The present invention provides a system including a plurality of portable electric power supply devices each including a storage battery that stores electric power to be supplied to electrical equipment detachably connected, and an information providing apparatus that can communicate with the plurality of portable electric power supply devices over a network, wherein the information providing apparatus includes a receiving unit configured to receive, from each electric power supply device, electric power information relating to an amount of electric power stored in each storage battery and a feature quantity relating to electric power supplied to each piece of electrical equipment, a calculating unit configured to calculate an amount of electric power used by a user of each electric power supply device based on the electric power information received by the receiving unit, an inferring unit configured to infer a kind of each piece of electrical equipment based on the feature quantity received by the receiving unit, and a determining unit configured to determine an added value to be provided to the user of each electric power supply device based on the amount of electric power calculated by the calculating unit and the kind of each piece of electrical equipment inferred by the inferring unit, wherein in a case where the kind of each piece of electrical equipment inferred by the inferring unit is a specified kind of electrical equipment, the determining unit determines the added value to be provided to the user in such a manner that the added value to be provided to the user is higher than an added value in a case where the kind of each piece of electrical equipment inferred by the inferring unit is not the specified kind of electrical equipment.

According to the present invention, a technique having an advantage in managing surplus electric power of a portable electric power supply device can be provided.

Other features and advantages of the present invention will be apparent from the following description taken in conjunction with the accompanying drawings.

BRIEF DESCRIPTION OF THE DRAWINGS

The accompanying drawings, which are incorporated in and constitute a part of the specification, illustrate embodiments of the invention and, together with the description, serve to explain principles of the invention.

FIG. 6 is a diagram illustrating an example of an image displayed by the user terminal illustrated in FIG. 1.

DESCRIPTION OF THE EMBODIMENTS

Figure 1:
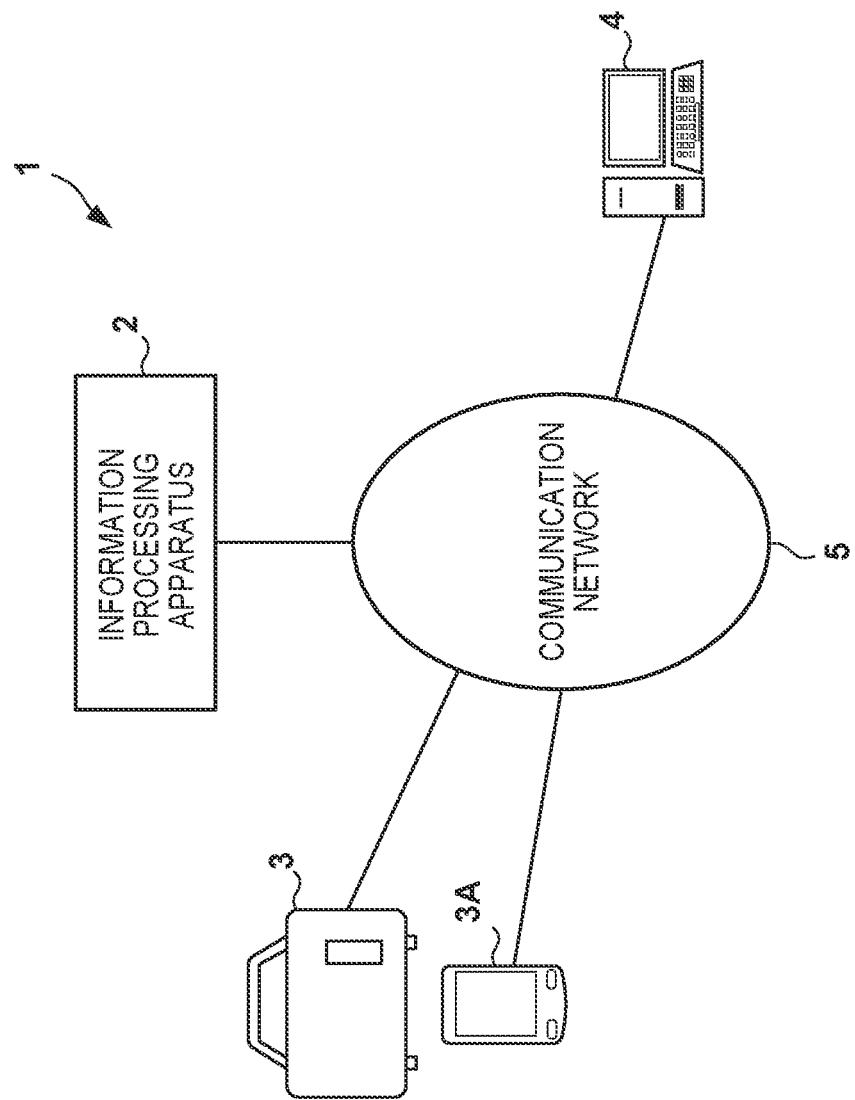
FIG. 1 is a schematic diagram illustrating a configuration of an information providing system as an aspect of the present invention.

A preferred embodiment of the present invention will be described below with reference to the attached drawings. Note that, in each drawing, the same reference numerals are given to the same members, and redundant description thereof is omitted.

FIG. 1 is a schematic diagram illustrating a configuration of an information providing system 1 as an aspect of the present invention. The information providing system 1 includes an information providing apparatus 2, a portable electric power supply device 3 (hereinafter, simply referred to as "electric power supply device 3"), a user terminal 3A, and a terminal 4. In the information providing system 1, the information providing apparatus 2, the electric power supply device 3, the user terminal 3A, and the terminal 4 are connected to each other over a communication network 5, so as to be able to communicate with each other. Although FIG. 1 illustrates, as an example, a case where one electric power supply device 3 (user terminal 3A) and one terminal 4 constitute the information providing system 1 by way of example, numbers of electric power supply devices 3 (user terminals 3A) and terminals 4 constituting the information providing system 1 may be each more than one.

The information providing apparatus 2 is formed of, for example, a computer including a CPU, memory, and the like and functions as an information providing server in the information providing system 1.

The electric power supply device 3 is a device that supplies electric power to electrical equipment and is a portable device rather than a stationary device. The electric power supply device 3 is therefore carried to a site of use in accordance with its user's application such as for recreation, for business, and in emergency. In the present embodiment, the electric power supply device 3 is rented from a rental service company.

The user terminal 3A is a terminal used by the user of the electric power supply device 3 and, for example, a computer or a portable terminal including a CPU, memory, and the like. The user terminal 3A includes a display device and a communication device. In the present embodiment, information to be provided to the user of the electric power supply device 3 is provided (transmitted) from the information providing apparatus 2 to the user terminal 3A. However, in a case where the electric power supply device 3 has functions equivalent to those of the user terminal 3A, it is possible to provide the electric power supply device 3 with the information to be provided to the user of the electric power supply device 3. In addition, the user of the electric power supply device 3 may be allowed to select (set) one of the user terminal 3A and the electric power supply device 3 as a destination of the information provided from the information providing apparatus 2.

The terminal 4 is a terminal used by a service provider that manages the information providing apparatus 2 (information providing system 1) and is, for example, a computer or a portable terminal including a CPU, memory, and the like. The terminal 4 includes a display device and a communication device. Here, the service provider is a company that provides the user of the electric power supply device 3 with information useful for such a user; in the present embodiment, the service provider is a rental service company of the electric power supply device 3.

In the information providing system 1, the information providing apparatus 2 collects (receives), from the electric power supply device 3 over the communication network 5 such as the Internet, electric power information relating to an amount of electric power stored (accumulated) in the electric power supply device 3. Next, the information providing apparatus 2 calculates an amount of electric power used by the user of the electric power supply device 3 (an amount of electric power used during the rental of the electric power supply device 3) based on the collected electric power information. Then, based on the calculated amount of electric power, the information providing apparatus 2 determines an added value to be provided to the user of the electric power supply device 3.

With the information provided from the information providing apparatus 2, the user of the electric power supply device 3 can recognize the added value provided from the service provider that manages the information providing apparatus 2, for example, the rental service company of the electric power supply device 3, and can obtain information useful in using the electric power supply device 3. The service provider that manages the information providing apparatus 2 can obtain the electric power information relating to the electric power stored in the electric power supply device 3, and thus, for example, the service provider can obtain information useful in managing the electric power supply device 3 to be rented to the user.

Figure 2:
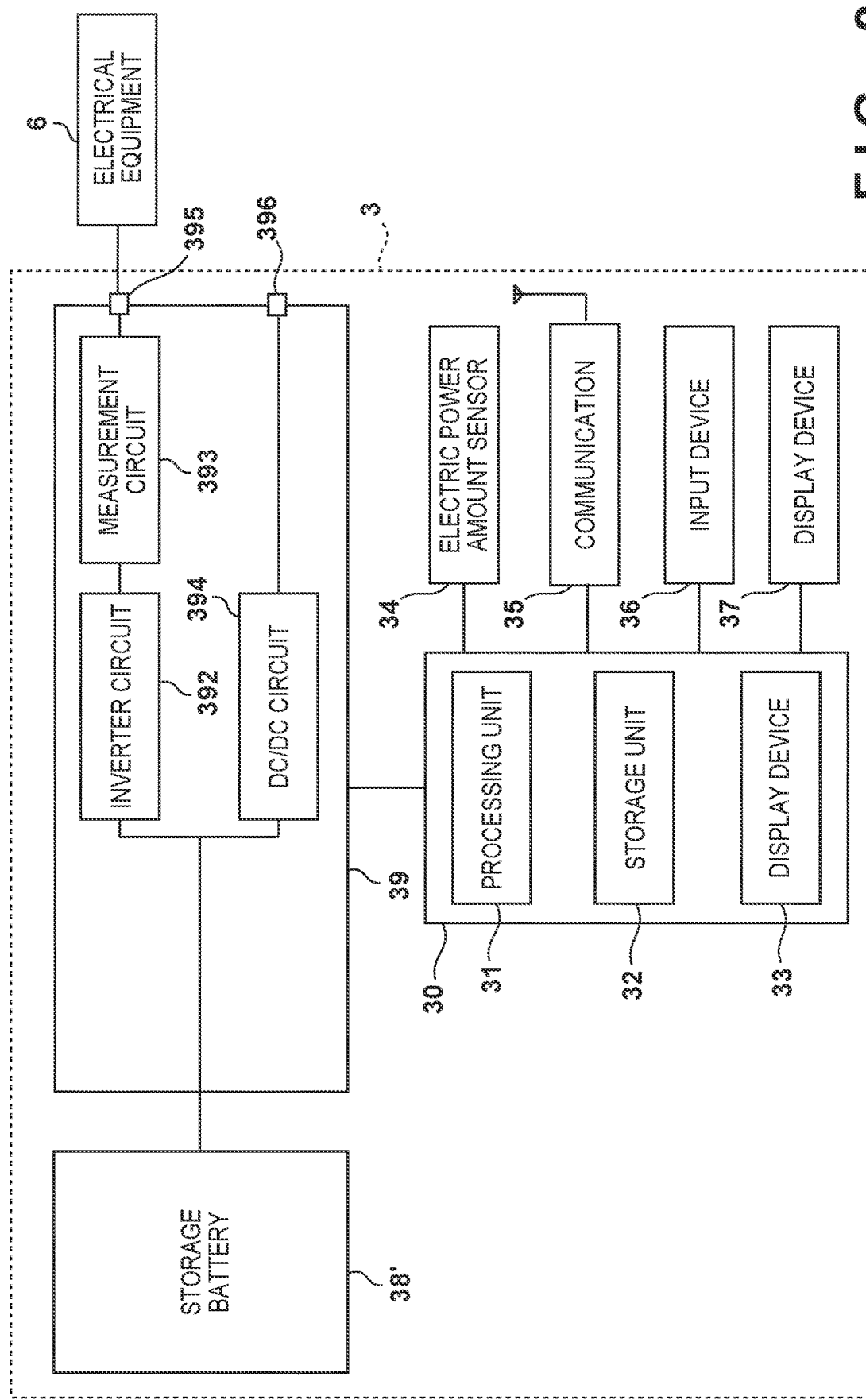
FIG. 2 is a schematic block diagram illustrating a configuration of the electric power supply device illustrated in FIG. 1.

FIG. 2 is a schematic block diagram illustrating a configuration of the electric power supply device 3. In the present embodiment, the electric power supply device 3 includes a storage battery 38', an electric power circuit 39, a control circuit 30, an electric power amount sensor 34, a communication device 35, an input device 36, and a display device 37.

The storage battery 38' includes, for example, a secondary battery such as lithium-ion battery and outputs, for example, DC voltage at 48 V. The storage battery 38' can store electric power generated by an external electric power generator or the like or electric power provided from an external battery.

The electric power circuit 39 is a circuit that converts voltage stored in the storage battery 38' into predetermined AC or DC. The electric power circuit 39 includes an inverter circuit 392, a measurement circuit 393, and a DC/DC circuit 394.

The inverter circuit 392 includes a circuit that converts the DC supplied from the storage battery 38' into a stable AC of a predetermined frequency.

The measurement circuit 393 includes a current sensor and a voltage sensor, measures AC voltage and AC current supplied from the inverter circuit 392 to electrical equipment 6 connected to an AC outlet 395, and outputs a result of the measurement to the control circuit 30. To the AC outlet 395, the electrical equipment 6 that can be driven by AC power is detachably connected. The electrical equipment 6 includes various kinds of electrical apparatuses; examples of the electrical equipment 6 include cooking appliances (hot plate, kettle, microwave oven, grill, mixer, etc.), air conditioners, televisions, luminaires, dryers, power tools, large light fixtures, and compressors.

The DC/DC circuit 394 converts a level of the DC voltage output from the storage battery 38', and DC voltage at the converted level is supplied to the control circuit 30 or the like as operating voltage or output through a DC outlet 396. To the DC outlet 396, the electrical equipment 6 that can be driven by DC power is detachably connected.

The control circuit 30 is a circuit for controlling the electric power supply device 3. The control circuit 30 includes a processing unit 31, a storage unit 32, and an interface (I/F) unit 33. The processing unit 31 includes a processor, typically a CPU, and executes a program retained in the storage unit 32. The storage unit 32 includes a storage device such as a RAM, a ROM, and a hard disk. In the storage unit 32, the program to be executed by the processing unit 31 and various kinds of data are retained (stored). The I/F unit 33 relays signals transmitted and received between an external device and the processing unit 31.

The electric power amount sensor 34 detects an amount of electric power stored in the storage battery 38'. To the electric power amount sensor 34, any technique known in the industry is applicable, such as a voltage method in which the amount of electric power stored in the storage battery 38' is determined by measuring a terminal voltage of the storage battery 38', a coulomb counting method in which the amount of electric power stored in the storage battery 38' is determined by measuring current flowing into the storage battery 38' and current flowing out from the storage battery 38', a battery cell modeling method in which the coulomb counting method is employed in combination with a database that stores discharge properties and temperature properties of the storage battery 38', and an impedance tracking method in which the amount of electric power stored in the storage battery 38' is determined by capturing an impedance of the storage battery 38'.

The communication device 35 is a wireless communication device or a wired communication device that performs information communication with the information providing apparatus 2 over the communication network 5. The input device 36 is a device that receives operation input by the user of the electric power supply device 3, and includes, for example, a plurality of switches. The display device 37 is a device that displays information to the user of the electric power supply device 3, and includes, for example, an image display device such as a liquid crystal display (LCD) and a light-emitting element such as a light-emitting diode (LED).

The processing unit 31 transmits a result of the detection by the electric power amount sensor 34 to the information providing apparatus 2 via the communication device 35, as electric power information relating to the amount of electric power accumulated in the storage battery 38'. The processing unit 31 also transmits the result of the measurement by the measurement circuit 393 to the information providing apparatus 2 via the communication device 35. The result of the measurement by the measurement circuit 393 is available as information relating to a kind of the electrical equipment 6 connected to the AC outlet 395 of the electric power supply device 3; for example, the result is available for inferring the kind of the electrical equipment 6. The electric power supplied from the electric power supply device 3 to the electrical equipment 6 shows a waveform (feature quantities) that characterizes the kind of the electrical equipment 6. Therefore, such feature quantities enable the inference of the kind of the electrical equipment 6 connected to the AC outlet 395.

Examples of the feature quantities include apparent power and power factor. The power factor may be calculated by dividing active power by apparent power or may be calculated as a cosine of a phase difference $\theta$ ($\cos \theta$) between voltage and current. In a case where the power factor is calculated as a cosine of a phase difference between voltage and current, the measurement circuit 393 measured the phase difference $\theta$. Moreover, the feature quantities may include a time taken by the electrical equipment 6 for its stable operation since its startup or may include a peak value of starting current which flows through the electrical equipment 6 at a time of the startup of the electrical equipment 6. Relations between the feature quantities and kinds of the electrical equipment 6 are then converted into data beforehand as a feature quantity map, and such a feature quantity map is compared with (checked against) feature quantities obtained from the result of the measurement by the measurement circuit 393, by which the kind of the electrical equipment 6 can be inferred.

Figure 3:
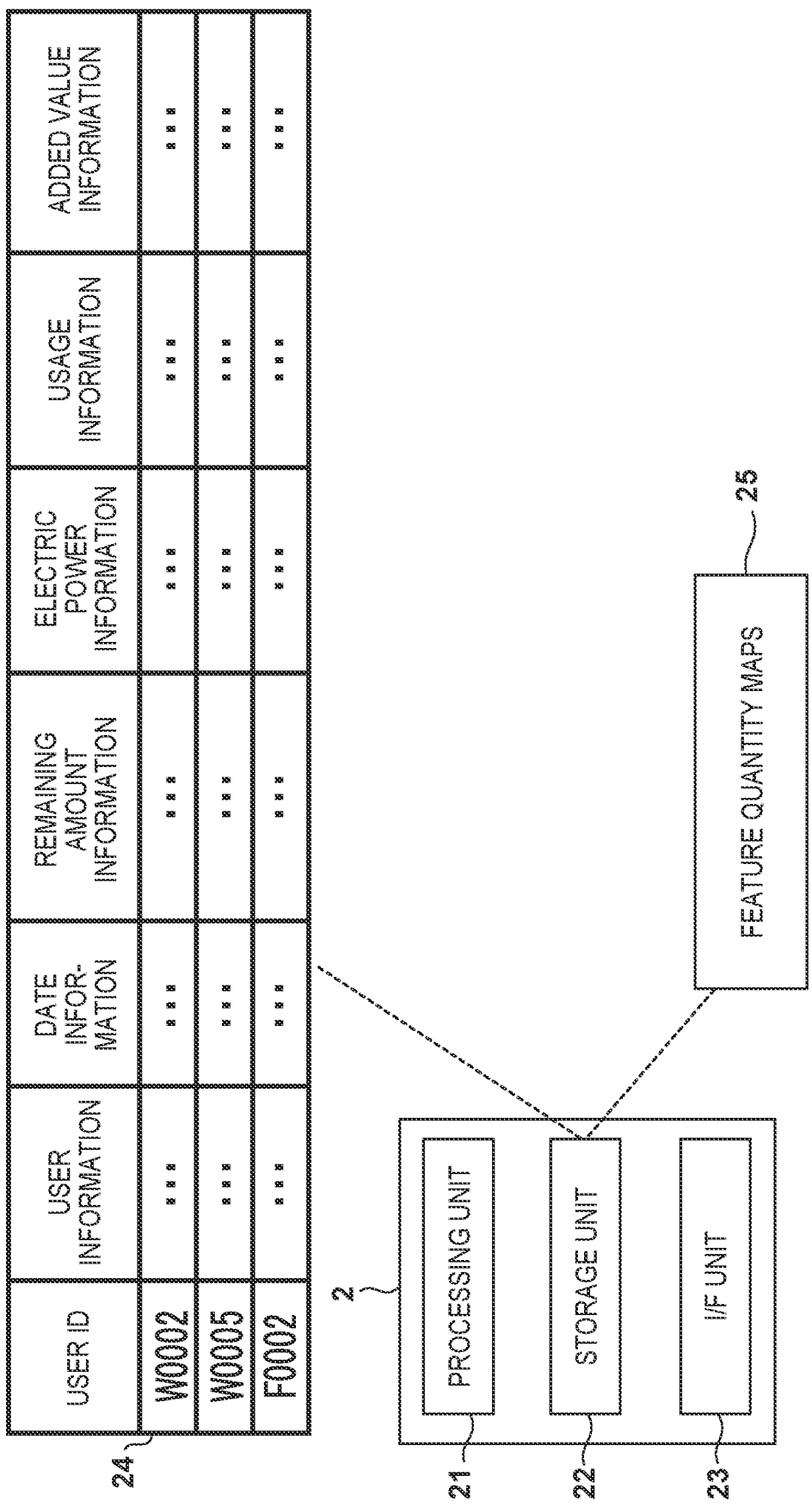
FIG. 3 is a schematic block diagram illustrating a configuration of an information providing apparatus illustrated in FIG. 1.

FIG. 3 is a schematic block diagram illustrating a configuration of the information providing apparatus 2. The information providing apparatus 2 includes a processing unit 21, a storage unit 22, and an interface (I/F) unit 23. The processing unit 21 includes a processor, typically a CPU, and executes a program retained in the storage unit 22. The storage unit 22 includes a storage device such as a RAM, a ROM, and a hard disk. The I/F unit 23 relays signals transmitted and received between an external device and the processing unit 21. The I/F unit 23 includes a wired or wireless communication interface that can communicate with the electric power supply device 3, the user terminal 3A, and the terminal 4 over the communication network 5.

In the storage unit 22, the program to be executed by the processing unit 21 and various kinds of data are retained (stored). In the present embodiment, as illustrated in FIG. 3, databases 24 and 25 are exemplified as the data retained in the storage unit 22.

The database 24 is a database that accumulates pieces of information relating to electric power supply devices 3 and users of the electric power supply devices 3. "User ID" is an identifier that is preassigned for recognizing (identifying) a user of an electric power supply device 3, namely, user identification information. "User Information" is information relating to the user of the electric power supply device 3 recognized with the "User ID" and includes, for example, a name, an address, and an email address. "Date Information" is information relating to a date of receiving electric power information relating to an amount of electric power stored in the storage battery 38' transmitted from the electric power supply device 3 and includes, for example, a year, month, and day. "At-rental Remaining Amount Information" retains (stores) information relating to the amount of electric power that is stored in the storage battery 38' when the electric power supply device 3 is rented to the user. When the electric power supply device 3 is rented to the user, "At-rental Remaining Amount Information" is transmitted to the information providing apparatus 2 via the terminal 4 by the rental service company of the electric power supply device 3. "Electric Power Information" retains (stores) the electric power information received from the electric power supply device 3, namely, the amount of electric power accumulated in the storage battery 38' of the electric power supply device 3. "Usage Information" retains (stores) a difference between the amount of electric power equivalent to the "Electric Power Information" and the amount of electric power equivalent to "At-Rental Remaining Amount Information", namely, an amount of electric power used by the user during the rental of the electric power supply device 3. Information relating to a remaining amount of electric power stored in the storage battery 38' of the electric power supply device 3 is retained (stored). "Added Value Information" retains (stores) an added value, which is information related to (a number of) reward points in the present embodiment, to be provided to the user when the electric power supply device 3 is returned to the rental service company.

The database 25 is a database that accumulates feature quantity maps. The processing unit 21 compares the feature quantity maps with the result of the measurement by the measurement circuit 393 transmitted from the electric power supply device 3 to infer the kind of the electrical equipment 6 connected to the AC outlet 395 of the electric power supply device 3. In the present embodiment, although the kind of the electrical equipment 6 connected to the AC outlet 395 is inferred by the information providing apparatus 2, the kind of the electrical equipment 6 connected to the AC outlet 395 may be inferred by the electric power supply device 3, and a result of the inference may be transmitted (provided) to the information providing apparatus 2.

Figure 4:
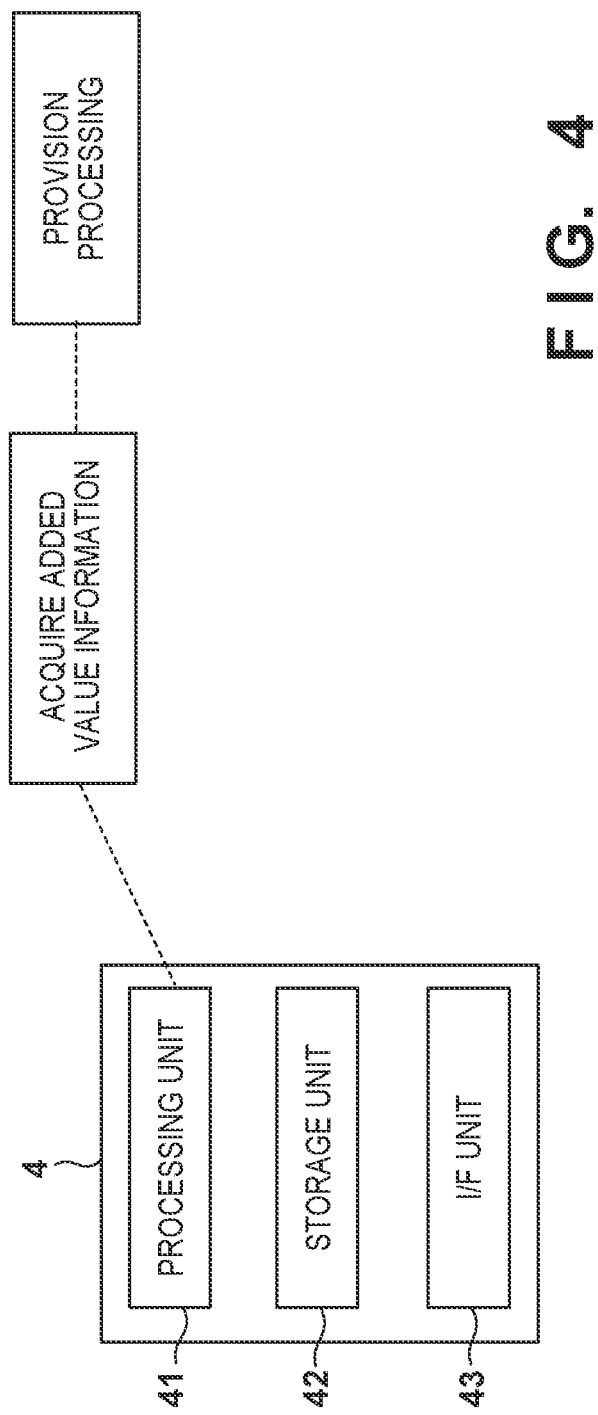
FIG. 4 is a schematic block diagram illustrating a configuration of a terminal illustrated in FIG. 1.

FIG. 4 is a schematic block diagram illustrating a configuration of the terminal 4. The terminal 4 is installed in, for example, a rental service facility for the electric power supply device 3 operated by the service provider that manages the information providing apparatus 2. The terminal 4 includes a processing unit 41, a storage unit 42, and an interface (I/F) unit 43. The processing unit 41 includes a processor, typically a CPU, and executes a program retained in the storage unit 42. The storage unit 42 includes a storage device such as a RAM, a ROM, and a hard disk. The I/F unit 43 relays signals transmitted and received between an external device and the processing unit 41. The I/F unit 43 includes a wired or wireless communication interface that can communicate with the information providing apparatus 2, the user terminal 3A, and the terminal 4 over the communication network 5.

Figure 5:
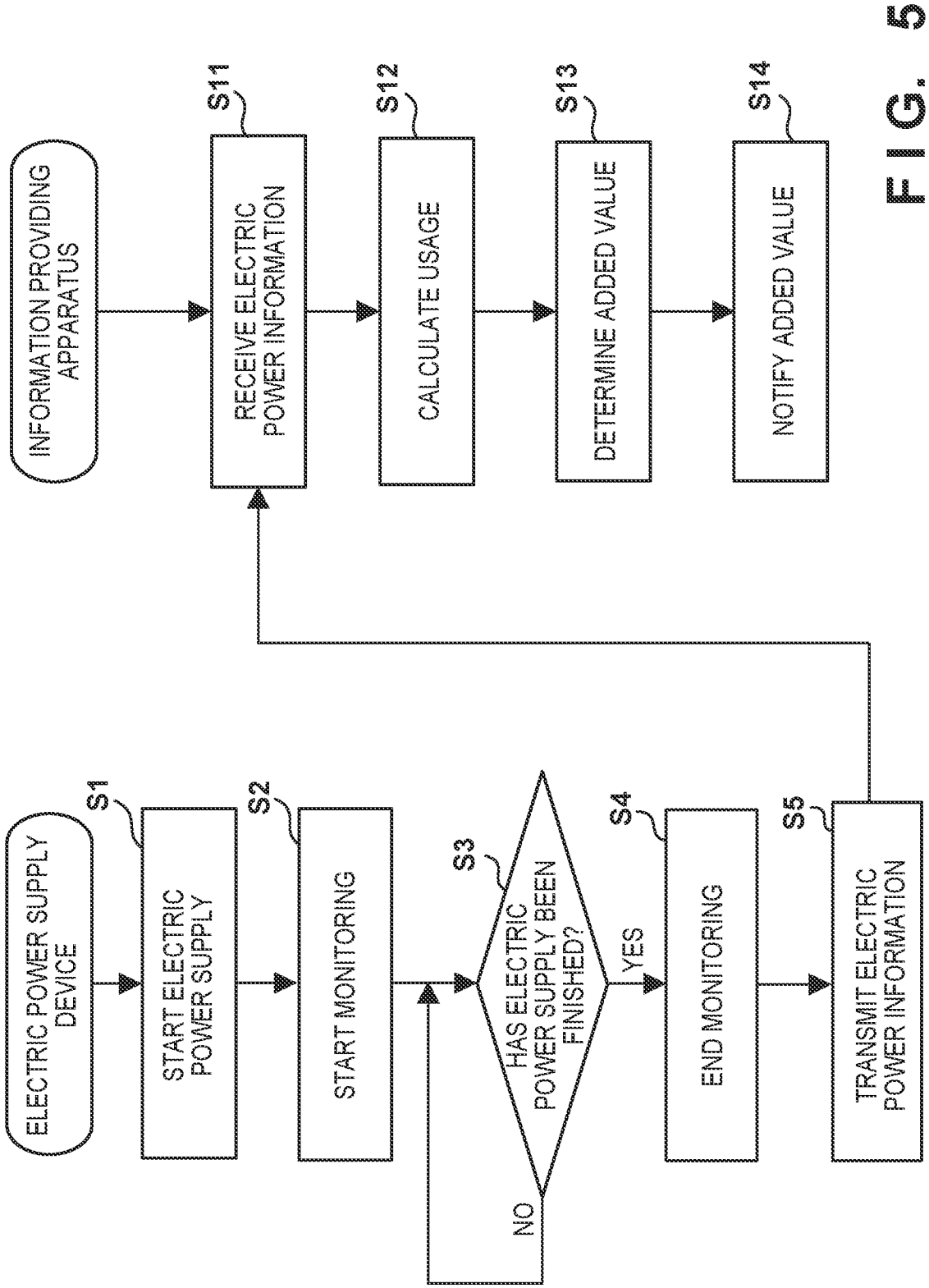
FIG. 5 is a flowchart used for describing an example of processing by the information providing system illustrated in FIG. 1.

Referring to FIG. 5, an example of processing by the information providing system 1 will be described. Here, an example of processing performed between the information providing apparatus 2 and the electric power supply device 3 will be mainly described. The processing illustrated in FIG. 5 is performed by the processing unit 21 in the information providing apparatus 2 and performed by the processing unit 31 in the electric power supply device 3.

In S1, supply of electric power to the electrical equipment 6 is started in the electric power supply device 3. Specifically, electric power stored in the storage battery 38' of the electric power supply device 3 is supplied to the electrical equipment 6.

In S2, monitoring of the electric power amount sensor 34 and the measurement circuit 393 is started. Upon the start of the monitoring, results of the detection by the electric power amount sensor 34 and results of the measurement by the measurement circuit 393 are accumulated in the storage unit 32 every predetermined sampling period.

In S3, whether the supply of the electric power from the electric power supply device 3 to the electrical equipment 6 has been finished is determined. Such determination can be performed using, for example, the results of the detection by the electric power amount sensor 34 and the results of the measurement by the measurement circuit 393. In a case where the supply of the electric power from the electric power supply device 3 to the electrical equipment 6 has been finished, the processing proceeds to S4 to finish the monitoring of the electric power amount sensor 34 and the measurement circuit 393. In a case where the supply of the electric power from the electric power supply device 3 to the electrical equipment 6 has not been finished, S3 is repeated every predetermined period.

In S5, the results of the detection by the electric power amount sensor 34 accumulated in the storage unit 32 are transmitted to the information providing apparatus 2 as electric power information relating to an amount of electric power accumulated in the storage battery 38'. The electric power information is transmitted to the information providing apparatus 2 together with a user ID used for identifying a user of the electric power supply device 3. In the present embodiment, the electric power information is information indicating a history of the amount of electric power stored in the storage battery 38', but only electric power information at a time when the supply of the electric power from the electric power supply device 3 to the electrical equipment 6 is finished may be transmitted to the information providing apparatus 2. In the present embodiment, the electric power information is transmitted after the supply of the electric power from the electric power supply device 3 to the electrical equipment 6 has been finished, but note that this does not limit the present invention; the electric power information may be transmitted in real time. Together with the electric power information, the results of the measurement by the measurement circuit 393 accumulated in the storage unit 32 may be transmitted to the information providing apparatus 2.

In S11, in the information providing apparatus 2, the electric power information associated with the user ID and the specifications information that is transmitted from the electric power supply device 3 is received. Then, based on the electric power information received from the electric power supply device 3, the database 24 is updated. Specifically, the amount of electric power stored in the storage battery 38' of the electric power supply device 3, which is included in the received electric power information, is retained in "Electric Power Information" of the database 24 with the user ID associated with the amount of electric power. Furthermore, a date (year, month, and day) when the electric power information is received is retained in "Date Information" of the database 24.

In S12, based on the electric power information received in S11, the amount of electric power used by the user (usage) during the rental of the electric power supply device 3 is calculated. As described above, in the present embodiment, the difference between the amounts of electric power equivalent to "Electric Power Information" and "At-Rental Remaining Amount Information" retained in the storage unit 22 (database 24) of the information providing apparatus 2 is determined as the usage. Then, the calculated usage is retained in "Usage Information" of the database 24.

In S13, based on the usage calculated in S12, an added value to be provided to the user when the electric power supply device 3 is returned to the rental service company. In the present embodiment, the remaining amount of electric power stored in the storage battery 38' of the electric power supply device 3 obtained from the amount of electric power calculated in S12, namely, reward points equivalent to the difference between the amounts of electric power equivalent to "At-Rental Remaining Amount Information" and "Usage Information" retained in the storage unit 22 (database 24) of the information providing apparatus 2 is determined as the added value to be provided to the user. Alternatively, the reward points to be provided to the user may be determined based on the amount of electric power equivalent to "Electric Power Information" retained in the storage unit 22 of the information providing apparatus 2. In a case where, for example, the electrical equipment 6 inferred from the result of the measurement by the measurement circuit 393 is electrical equipment specified by the rental service company, reward points more than usual may be provided to the user. Then, the determined added value (reward points) is retained in "Added Value" of the database 24.

Figure 6:
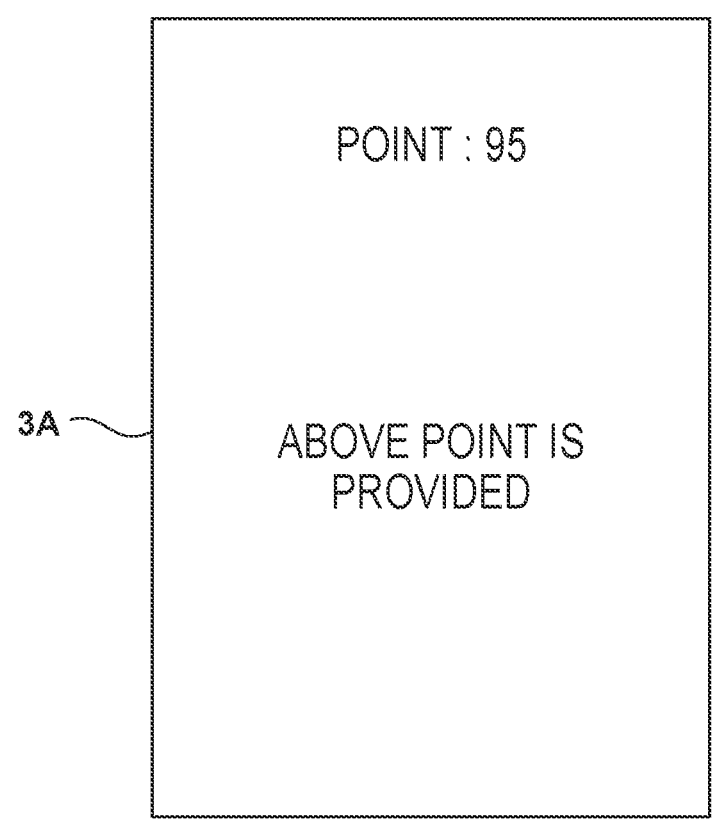

In S14, the added value determined in S13 is notified to the user of the electric power supply device 3. In the present embodiment, an image (image data) used for the notification of the added value determined in S13 is transmitted from the information providing apparatus 2 to the user terminal 3A to cause the user terminal 3A to display such an image. FIG. 6 is a diagram illustrating an example of the image used for the notification of the added value displayed by the user terminal 3A. As illustrated in FIG. 6, the image displayed by the user terminal 3A includes the added value (to be) provided to the user, which is (an amount of) reward points in the present embodiment. The image illustrated in FIG. 6 may additionally include, for example, the amount of electric power used by the user during the rental of the electric power supply device 3 (usage), the remaining amount of electric power stored in the storage battery 38', and a location of a nearest rental service facility where the electric power supply device 3 can be returned.

As seen from the above, in the present embodiment, the amount of electric power used by the user during the rental of the electric power supply device 3 is calculated, and the added value to be provided to the user is determined and notified to the user when the electric power supply device 3 is returned to the rental service company. This enables the user to recognize the added value to be provided from the rental service company of the electric power supply device 3, obtaining information useful in using the electric power supply device 3. At the same time, the rental service company of the electric power supply device 3 can obtain the electric power information relating to the electric power stored in the electric power supply device 3, thus obtaining, for example, information useful in managing the electric power supply device 3 to be rented to the user.

In the present embodiment, the added value to be provided to the user is determined and notified with a timing at which the supply of the electric power from the electric power supply device 3 to the electrical equipment 6 is finished, but note that this does not limit the present invention. For example, the added value to be provided to the user may be determined and notified in response to a request from the user of the electric power supply device 3 (i.e., with any timing).

Here, a case where the user of the electric power supply device 3 brings the electric power supply device 3 to a rental service facility to return the electric power supply device 3 will be described. In such a rental service facility, a terminal 4 used by the service provider that manages the information providing apparatus 2, namely the rental service company, is installed, as described above.

The processing unit 41 of the terminal 4 acquires, via the I/F unit 43, "Added Value Information" relating to the electric power supply device 3 returned from the user, namely, information relating to the added value (reward points) to be provided to the user of such an electric power supply device 3, from the storage unit 22 (database 24) of the information providing apparatus 2. The processing unit 41 then performs provision processing for providing the user with the added value. The provision processing includes, for example, causing the information providing apparatus 2 to retain (store) the reward points equivalent to "Added Value Information" in "User Information" of the storage unit 22 (database 24) and transmitting instructions to reset "Added Value Information". Upon receiving such instructions, the information providing apparatus 2 retains (stores) the reward points equivalent to "Added Value Information" in "User Information" of the storage unit 22 (database 24) and resets "Added Value Information". As seen from the above, the added value is provided to the user by the information providing apparatus 2 in the present embodiment, but the added value may be provided to the user by the terminal 4. Here, the added value is used for, for example, discounting a rental fee for the next rental of the electric power supply device 3 to the user.

Figure 7:
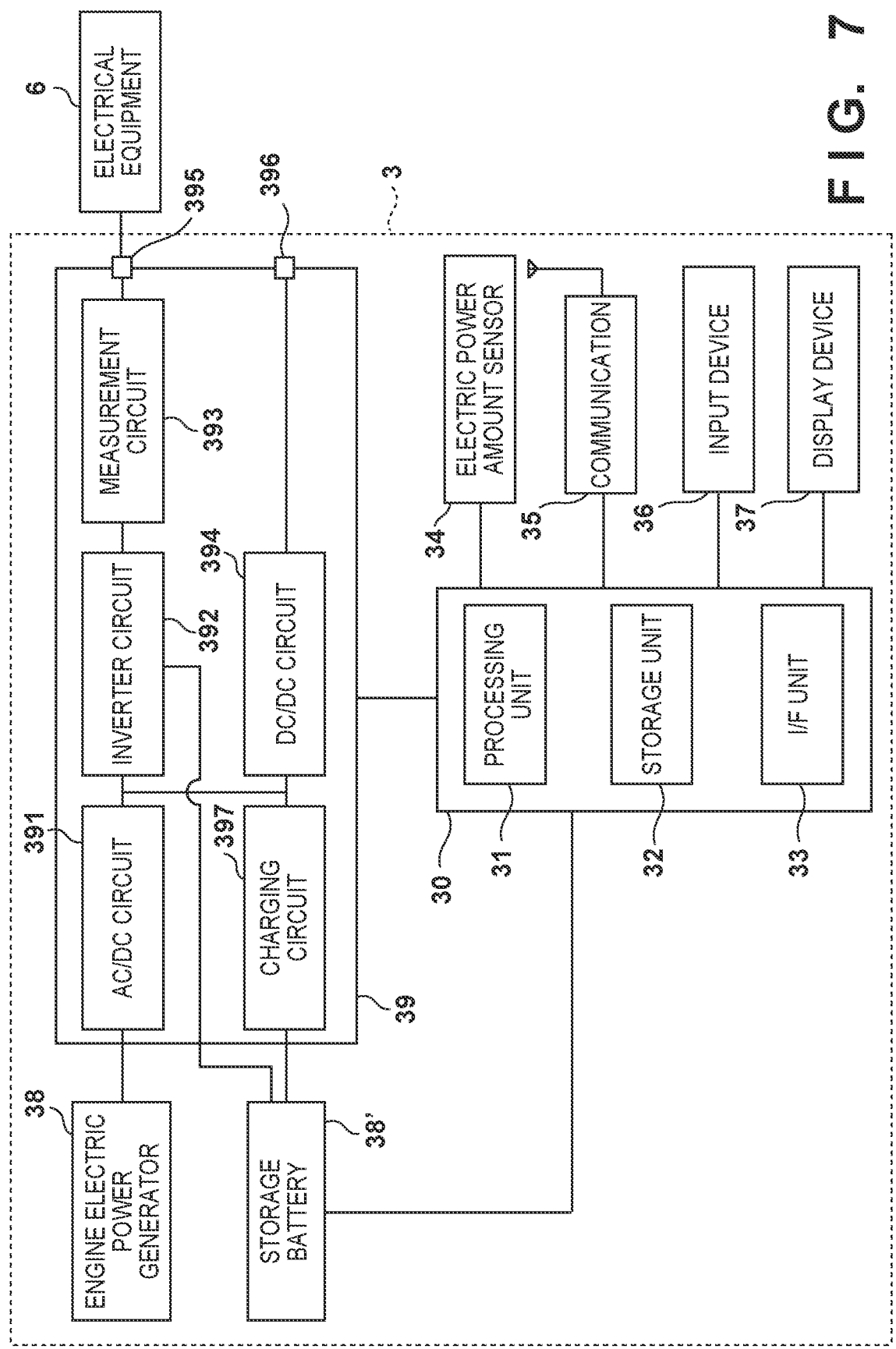
FIG. 7 is a schematic block diagram illustrating another configuration of the electric power supply device illustrated in FIG. 1.

The electric power supply device 3 may include an engine electric power generator 38 as illustrated in FIG. 7. In this case, the electric power supply device 3 additionally includes an AC/DC circuit 391 and a charging circuit 397. The engine electric power generator 38 is driven by fuel to generate AC power. Examples of the fuel include gasoline, liquefied petroleum gas, and hydrogen. The storage battery 38' stores electric power generated by the engine electric power generator 38. The AC/DC circuit 391 includes a rectifying-smoothing circuit that rectifies and smooths the AC generated by the engine electric power generator 38. The charging circuit 397 charges the storage battery 38' with the electric power generated by the engine electric power generator 38. FIG. 7 is a schematic block diagram illustrating another configuration of the electric power supply device 3.

Preferred embodiments according to the present invention are described above, but it should be appreciated that the present invention is not limited to these embodiments, and various changes and modifications are possible within the spirit of the present invention.

SUMMARY OF EMBODIMENT

1. The information providing apparatus in the above-described embodiment (e.g., 2) by including:
   a receiving unit (e.g., 23) configured to receive, from a portable electric power supply device (e.g., 3) including a storage battery (e.g., 38') that stores electric power to be supplied to electrical equipment detachably connected, electric power information relating to an amount of electric power stored in the storage battery and a feature quantity relating to electric power supplied to the electrical equipment;

a calculating unit (e.g., 21) configured to calculate an amount of electric power used by a user of the electric power supply device based on the electric power information received by the receiving unit;

an inferring unit (e.g., 21) configured to infer a kind of the electrical equipment based on the feature quantity received by the receiving unit; and a determining unit (e.g., 21) configured to determine an added value to be provided to the user of the electric power supply device based on the amount of electric power calculated by the calculating unit and the kind of the electrical equipment inferred by the inferring unit, wherein in a case where the kind of the electrical equipment inferred by the inferring unit is a specified kind of electrical equipment, the determining unit determines the added value to be provided to the user in such a manner that the added value to be provided to the user is higher than an added value in a case where the kind of the electrical equipment inferred by the inferring unit is not the specified kind of electrical equipment.

According to this embodiment, a technique that enables the user to recognize information useful in using the electric power supply device, for example, the added value to be provided from the rental service company of the electric power supply device can be provided.

2. The above-described information providing apparatus (e.g., 2)

wherein the calculating unit (e.g., 21) determines a difference between an amount of electric power equivalent to the electric power information received by the receiving unit and an amount of electric power that is stored in the storage battery (e.g., 38') when the electric power supply device (e.g., 3) is rented to the user as an amount of electric power used by the user of the electric power supply device.

According to this embodiment, the amount of electric power used by the user of the electric power supply device can be calculated quantitatively.

3. The above-described information providing apparatus (e.g., 2) further including a storage unit (e.g., 22) configured to retain information relating to an amount of electric power that is stored in the storage battery (e.g., 38') when the electric power supply device (e.g., 3) is rented to the user.

According to this embodiment, the amount of electric power used by the user of the electric power supply device can be calculated quantitatively based on the amount of electric power that is stored in the storage battery when the electric power supply device is rented to the user.

4. The above-described information providing apparatus (e.g., 2) further including a storage unit (e.g., 22) configured to retain the electric power information received by the receiving unit (e.g., 23) with user identification information used for identifying the user of the electric power supply device (e.g., 3) associated with the electric power information.

According to this embodiment, the electric power information can be managed for each user of an electric power supply device.

5. The above-described information providing apparatus (e.g., 2) wherein the determining unit (e.g., 21) determines the added value based on a remaining amount of electric power stored in the storage battery that is obtained from the amount of electric power calculated by the calculating unit (e.g., 21).

According to this embodiment, the added value equivalent to the remaining amount of electric power stored in the storage battery of the electric power supply device can be determined.

6. The above-described information providing apparatus (e.g., 2) further including a providing unit (e.g., 21) configured to provide the added value determined by the determining unit (e.g., 21) to the user of the electric power supply device (e.g., 3).

According to this embodiment, the added value can be provided to the user by the information providing apparatus.

7. The above-described information providing apparatus (e.g., 2)

wherein the providing unit (e.g., 21) associates the added value determined by the determining unit (e.g., 21) with the user identification information used for identifying the user of the electric power supply device (e.g., 3).

According to this embodiment, an added value to be provided to a user can be managed for each user.

8. The above-described information providing apparatus (e.g., 2)

wherein the providing unit (e.g., 21) notifies the user of the electric power supply device of the added value determined by the determining unit (e.g., 21).

According to this embodiment, for example, the user can easily recognize the added value provided from the rental service company of the electric power supply device.

9. An information providing method in the above-described embodiment including:

a server (e.g., 2) receiving, from a portable electric power supply device (e.g., 3) including a storage battery (e.g., 38') that stores electric power to be supplied to electrical equipment (e.g., 6) detachably connected, electric power information relating to an amount of electric power stored in the storage battery and a feature quantity relating to electric power supplied to the electrical equipment;

the server calculating an amount of electric power used by the user of the electric power supply device based on the electric power information received;

the server inferring a kind of the electrical equipment based on the feature quantity received; and the server determining an added value to be provided to the user of the electric power supply device based on the amount of electric power calculated and the kind of the electrical equipment inferred, wherein in the determining, in a case where the kind of the electrical equipment inferred is a specified kind of electrical equipment, the added value to be provided to the user is determined in such a manner that the added value to be provided to the user is higher than an added value in a case where the kind of the electrical equipment inferred is not the specified kind of electrical equipment.

According to this embodiment, a technique that enables the user to recognize information useful in using the electric power supply device, for example, the added value to be provided from the rental service company of the electric power supply device can be provided.

10. A system in the above-described embodiment (e.g., 1) is a system including a portable electric power supply device (e.g., 3) including a storage battery (e.g., 38')

that stores electric power to be supplied to electrical equipment (e.g., 6) detachably connected, and an information providing apparatus (e.g., 2) that can communicate with the electric power supply device over a network (e.g., 5), wherein the information providing apparatus includes:

a receiving unit (e.g., 23) configured to receive, from the electric power supply device, electric power information relating to an amount of electric power stored in the storage battery and a feature quantity relating to electric power supplied to the electrical equipment;

a calculating unit (e.g., 21) configured to calculate an amount of electric power used by the user of the electric power supply device based on the electric power information received by the receiving unit;

an inferring unit (e.g., 21) configured to infer a kind of the electrical equipment based on the feature quantity received by the receiving unit; and a determining unit (e.g., 21) configured to determine an added value to be provided to the user of the electric power supply device based on the amount of electric power calculated by the calculating unit and the kind of the electrical equipment inferred by the inferring unit, wherein in a case where the kind of the electrical equipment inferred by the inferring unit is a specified kind of electrical equipment, the determining unit determines the added value to be provided to the user in such a manner that the added value to be provided to the user is higher than an added value in a case where the kind of the electrical equipment inferred by the inferring unit is not the specified kind of electrical equipment.

According to this embodiment, a technique that enables the user to recognize information useful in using the electric power supply device, for example, the added value to be provided from the rental service company of the electric power supply device can be provided.

11. The above-described system (e.g., 1), wherein the electric power supply device (e.g., 3) includes an electric power generator (e.g., 38) configured to generate electric power, and stores the electric power generated by the electric power generator in the storage battery (e.g., 38').

According to this embodiment, in addition to the storage battery, the electric power supply device can include an electric power generator used for storing electric power in the storage battery.

The present invention is not limited to the above embodiments and various changes and modifications can be made within the spirit and scope of the present invention. Therefore, to apprise the public of the scope of the present invention, the following claims are made.

What is claimed is:

1. An information providing apparatus comprising:

a receiving unit configured to receive, from a portable electric power supply device including a storage battery that stores electric power to be supplied to electrical equipment detachably connected, electric power information relating to an amount of electric power stored in the storage battery and a feature quantity relating to electric power supplied to the electrical equipment;

a calculating unit configured to calculate an amount of electric power used by a user of the electric power supply device based on the electric power information received by the receiving unit;

an inferring unit configured to infer a kind of the electrical equipment based on the feature quantity received by the receiving unit; and a determining unit configured to determine an added value to be provided to the user of the electric power supply device based on the amount of electric power calculated by the calculating unit and the kind of the electrical equipment inferred by the inferring unit, wherein in a case where the kind of the electrical equipment inferred by the inferring unit is a specified kind of electrical equipment, the determining unit determines the added value to be provided to the user in such a manner that the added value to be provided to the user is higher than an added value in a case where the kind of the electrical equipment inferred by the inferring unit is not the specified kind of electrical equipment.

2. The information providing apparatus according to claim 1, wherein the calculating unit determines a difference between an amount of electric power equivalent to the electric power information received by the receiving unit and an amount of electric power that is stored in the storage battery when the electric power supply device is rented to the user as an amount of electric power used by the user of the electric power supply device.

3. The information providing apparatus according to claim 2, further comprising a storage unit configured to retain information relating to an amount of electric power that is stored in the storage battery when the electric power supply device is rented to the user.

4. The information providing apparatus according to claim 1, further comprising a storage unit configured to retain the electric power information received by the receiving unit with user identification information used for identifying the user of the electric power supply device associated with the electric power information.

5. The information providing apparatus according to claim 1, wherein the determining unit determines the added value based on a remaining amount of electric power stored in the storage battery that is obtained from the amount of electric power calculated by the calculating unit.

6. The information providing apparatus according to claim 1, further comprising providing unit configured to provide the added value determined by the determining unit to the user of the electric power supply device.

7. The information providing apparatus according to claim 6, wherein the providing unit associates the added value determined by the determining unit with user identification information used for identifying the user of the electric power supply device.

8. The information providing apparatus according to claim 6, wherein the providing unit notifies the user of the electric power supply device of the added value determined by the determining unit.

9. An information providing method comprising:

a server receiving, from a portable electric power supply device including a storage battery that stores electric power to be supplied to electrical equipment detachably connected, electric power information relating to an amount of electric power stored in the storage battery and a feature quantity relating to electric power supplied to the electrical equipment;

the server calculating an amount of electric power used by the user of the electric power supply device based on the electric power information received;

the server inferring a kind of the electrical equipment based on the feature quantity received; and the server determining an added value to be provided to the user of the electric power supply device based on the amount of electric power calculated and the kind of the electrical equipment inferred, wherein in the determining, in a case where the kind of the electrical equipment inferred is a specified kind of electrical equipment, the added value to be provided to the user is determined in such a manner that the added value to be provided to the user is higher than an added value in a case where the kind of the electrical equipment inferred is not the specified kind of electrical equipment.

10. A system including a plurality of portable electric power supply devices each including a storage battery that stores electric power to be supplied to a piece of electrical equipment detachably connected, and an information providing apparatus capable of communicating with the plurality of portable electric power supply devices over a network, wherein the information providing apparatus includes:

a receiving unit configured to receive, from each electric power supply device, electric power information relating to an amount of electric power stored in each storage battery and a feature quantity relating to electric power supplied to each piece of electrical equipment;

a calculating unit configured to calculate an amount of electric power used by a user of each electric power supply device based on the electric power information received by the receiving unit;

an inferring unit configured to infer a kind of each piece of electrical equipment based on the feature quantity received by the receiving unit; and a determining unit configured to determine an added value to be provided to the user of each electric power supply device based on the amount of electric power calculated by the calculating unit and the kind of each piece of electrical equipment inferred by the inferring unit, wherein in a case where the kind of each piece of electrical equipment inferred by the inferring unit is a specified kind of electrical equipment, the determining unit determines the added value to be provided to the user in such a manner that the added value to be provided to the user is higher than an added value in a case where the kind of each piece of electrical equipment inferred by the inferring unit is not the specified kind of electrical equipment.

11. The system according to claim 10, wherein each of the electric power supply devices includes an electric power generator configured to generate electric power, and stores the electric power generated by the electric power generator in each storage battery.

\* \* \* \* \*